US009117670B2

(12) United States Patent
Abedijaberi et al.

(10) Patent No.: US 9,117,670 B2
(45) Date of Patent: Aug. 25, 2015

(54) INJECT INSERT LINER ASSEMBLIES FOR CHEMICAL VAPOR DEPOSITION SYSTEMS AND METHODS OF USING SAME

(71) Applicant: MEMC Electronic Materials, Inc., St. Peters, MO (US)

(72) Inventors: Arash Abedijaberi, St. Peters, MO (US); John Allen Pitney, St. Peters, MO (US); Shawn Thomas, Gilbert, AZ (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 47 days.

(21) Appl. No.: 13/829,021

(22) Filed: Mar. 14, 2013

(65) Prior Publication Data

US 2014/0273410 A1 Sep. 18, 2014

(51) Int. Cl.
*C23F 1/00* (2006.01)
*H01L 21/306* (2006.01)
*H01L 21/02* (2006.01)
*C23C 16/455* (2006.01)

(52) U.S. Cl.
CPC ........ *H01L 21/02532* (2013.01); *C23C 16/455* (2013.01); *C23C 16/45517* (2013.01); *C23C 16/45561* (2013.01); *C23C 16/45578* (2013.01); *H01L 21/0262* (2013.01)

(58) Field of Classification Search
CPC ............ C23C 16/455; C23C 16/45561; C23C 16/45517; C23C 16/45578
USPC ................ 118/715, 724; 156/345.33, 345.34, 156/345.37
See application file for complete search history.

(56) References Cited

U.S. PATENT DOCUMENTS

| 6,024,799 A * | 2/2000 | Chen et al. ............... 118/715 |
| 6,436,193 B1 | 8/2002 | Kasai et al. |
| 6,500,734 B2 | 12/2002 | Anderson et al. |
| 6,502,530 B1 | 1/2003 | Turlot et al. |
| 7,289,865 B2 | 10/2007 | Bauer |
| 8,152,925 B2 | 4/2012 | Iizuka |
| 2004/0129210 A1 | 7/2004 | Murugesh |

(Continued)

FOREIGN PATENT DOCUMENTS

| EP | 1703549 A1 | 9/2006 |
| JP | 2003115459 A1 | 4/2003 |

(Continued)

OTHER PUBLICATIONS

Non-Final Office Action of U.S. Appl. No. 13/828,926, filed Sep. 29, 2014; 14 pages.

*Primary Examiner* — Rudy Zervigon
(74) *Attorney, Agent, or Firm* — Armstrong Teasdale LLP

(57) ABSTRACT

A system for depositing a layer on a substrate includes a processing chamber, a gas injecting port for introducing gas into the system, a gas distribution plate disposed between the gas injecting port and the processing chamber, the gas distribution plate including holes therein, and an inject insert liner assembly received within the system adjacent to the gas distribution plate and upstream from the processing chamber. The inject insert liner assembly defines gas flow channels therein extending along a lengthwise direction of the system, wherein each channel includes an inlet and an outlet, and at least one channel is tapered along the lengthwise direction of the system in at least one of a vertical or horizontal direction. The inject insert liner assembly has the same number of gas flow channels as the number of holes in the gas distribution plate.

23 Claims, 8 Drawing Sheets

(56) References Cited

U.S. PATENT DOCUMENTS

2006/0219362 A1 10/2006 Han et al.
2007/0281084 A1 12/2007 Hirosawa et al.
2010/0272892 A1 10/2010 Kobayashi et al.

FOREIGN PATENT DOCUMENTS

| JP | 2011249448 A1 | | 12/2011 | |
|----|---------------|---|---------|---|
| KR | 10-2005-0034459 | * | 4/2005 | ............ G06F 3/12 |
| WO | 2012128783 A1 | | 9/2012 | |

* cited by examiner

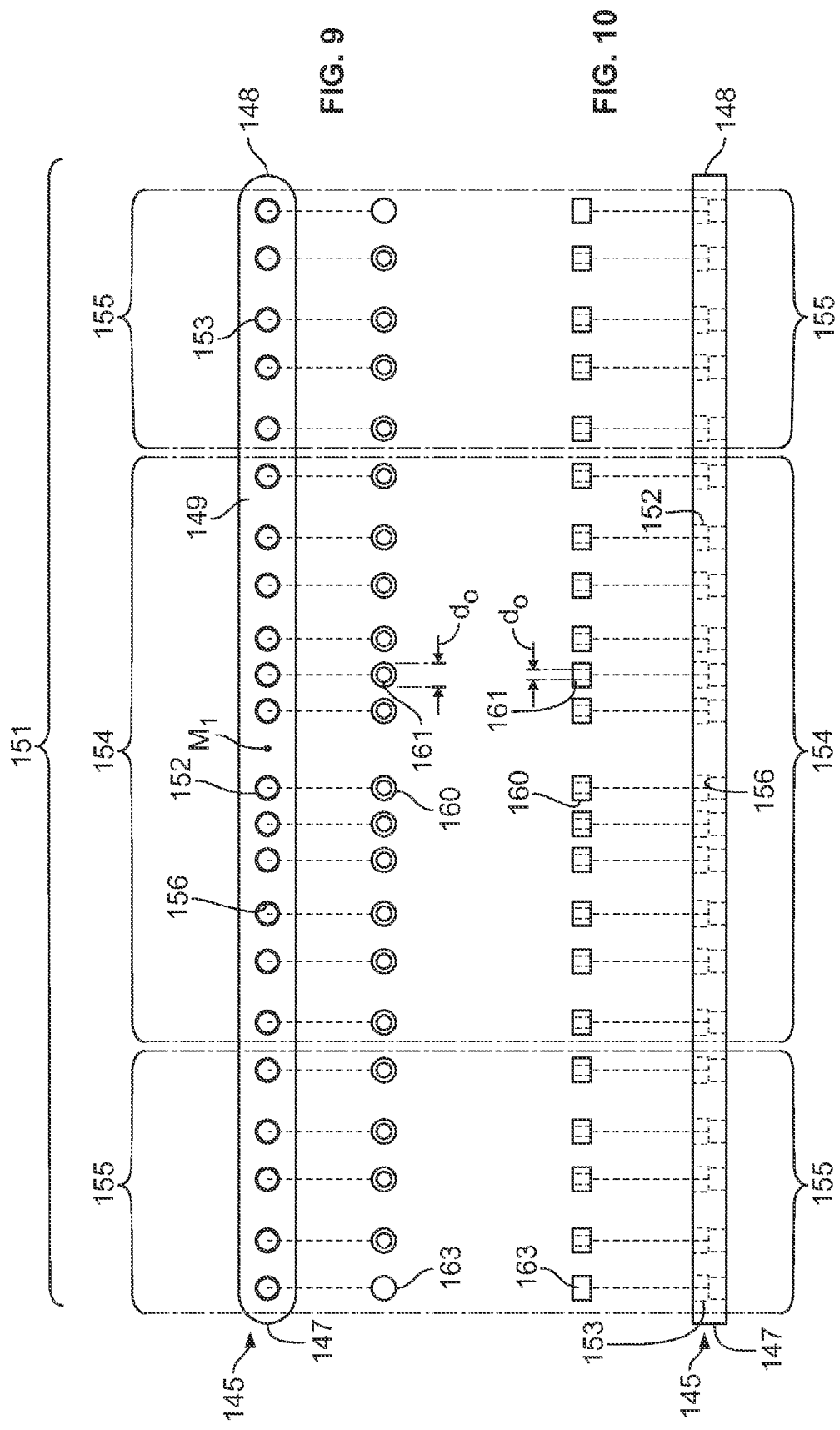

INJECT INSERT LINER ASSEMBLIES FOR CHEMICAL VAPOR DEPOSITION SYSTEMS AND METHODS OF USING SAME

FIELD

The field relates generally to the use of chemical vapor deposition systems in processing semiconductor wafers and, more specifically, to gas manifolds and to methods for controlling the uniformity of gas flow within a chemical vapor deposition process chamber.

BACKGROUND

In chemical vapor deposition (CVD) processes, including epitaxial growth processes, uniformity in the thickness of a deposited film on a substrate is dependent on, among other factors, uniformity in the flow distribution of gasses within the process chamber. As the requirements for uniformity in film thickness become more stringent, the desire for more uniform flow rate distribution of gasses in the process chamber increases.

In conventional CVD devices, a source gas is introduced into the process chamber through a gas manifold. The gas manifolds of conventional CVD devices do not provide adequate control of the gas flow distribution across the substrate surface in the processing chamber.

For example, baffle plates used in conventional gas manifolds have fixed hole sizes that cannot be adjusted without replacing the entire baffle plate. Thus, conventional baffle plates do not permit selective adjustment of the gas flow distribution across the substrate surface, which may be needed when changing process parameters such as the flow rate of the process gas.

Additionally, injection port liners and inject inserts used in conventional gas manifolds do not provide sufficient uniformity in the gas flow distribution across the substrate surface. For example, some injection port liners may include multiple flow zones having different process gases or gas flow rates which feed into a single channel defined within the inject insert. As a result of the "crosstalk" between the multiple flow zones feeding into a single inject insert channel, attempts to tune the gas flow distribution within the processing chamber by varying the type of gas or gas flow rate in the different flow zones have unpredictable tuning results.

Additionally, in operation, localized zones of cyclically flowing gas, known as "recirculation cells," often form within the channels of inject inserts used in conventional gas manifolds. Recirculation cells result in degraded uniformity of the gas flow distribution within the processing chamber, which results in strong variations in epitaxially-grown films.

The foregoing problems attributable to conventional gas manifolds are amplified when the flow rate of the process gas is increased, which is desirable to increase the throughput of the CVD device.

Accordingly, a need exists for a gas manifold capable of delivering a more uniform flow rate distribution across the surface of a substrate within the processing chamber.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for depositing a layer on a substrate is provided. The system includes a processing chamber, a gas injecting port, a gas distribution plate, and a plug. The gas injecting port is disposed upstream from the processing chamber. The gas distribution plate is disposed between the gas injecting port and the processing chamber, and includes an elongate planar body and an array of holes therein. The plug is sized to be received within one of the holes, and includes an orifice therethrough for permitting the passage of gas. The plug is capable of being removably secured to the gas distribution plate within one of the holes.

In another aspect, a method of depositing an epitaxial layer on a silicon wafer is described. The silicon wafer has a diameter, and is disposed within a processing chamber within a deposition system. The method includes the steps of introducing a process gas into the system from a gas injecting port, flowing the process gas through a gas distribution plate in fluid communication with the gas injecting port and the processing chamber, the gas distribution plate including an inner array of holes and an outer array of holes, and controlling the gas flow distribution across the substrate surface. The controlling step includes selecting at least one orifice-containing plug to be secured within a hole in the gas distribution plate, and securing the selected plug within the hole.

In yet another aspect, a system for depositing a layer on a substrate is provided. The system includes a processing chamber, a gas injecting port for introducing gas into the system, a gas distribution plate disposed between the gas injecting port and the processing chamber, the gas distribution plate including holes therein, and an inject insert liner assembly received within the system adjacent to the gas distribution plate and upstream from the processing chamber. The inject insert liner assembly defines gas flow channels therein extending along a lengthwise direction of the system, wherein each channel includes an inlet and an outlet, and at least one channel is tapered along the lengthwise direction of the system in at least one of a vertical or horizontal direction. The inject insert liner assembly has the same number of gas flow channels as the number of holes in the gas distribution plate.

In yet another aspect, a system for depositing a layer on a substrate is provided. The system includes a processing chamber, a gas injecting port for introducing gas into the system, a gas distribution plate disposed between the gas injecting port and the processing chamber, the gas distribution plate including holes therein, and an inject insert liner assembly received within the system adjacent to the gas distribution plate and upstream from the processing chamber. The inject insert liner assembly defines gas flow channels therein extending along a lengthwise direction of the system. Each channel has an inlet adjacent to the gas distribution plate and an outlet downstream from the inlet. Each channel is tapered along the lengthwise direction of the system in at least one of a vertical or horizontal direction.

In yet another aspect, a method of depositing an epitaxial layer on a wafer is described. The wafer has a diameter, and is disposed within a processing chamber within a deposition system. The deposition system includes a gas distribution plate in fluid communication with a gas injecting port and the processing chamber. The method includes the steps of introducing a process gas into the system from the gas injecting port, flowing the process gas through a flow channel extending along a lengthwise direction of the system and being tapered along the lengthwise direction of the system in at least one of a vertical or horizontal direction, wherein the flow channel is defined by an inject insert liner assembly adjacent to the gas distribution plate, and depositing an epitaxial layer on the wafer.

In yet another aspect, a method of depositing a layer on a silicon wafer is described. The silicon wafer has a diameter and is disposed within a processing chamber within a deposition system. The deposition system includes a gas distribution plate in fluid communication with a gas injecting port and the processing chamber. The method includes the steps of introducing a process gas into the system from the gas injecting port at a flow rate, wherein the flow rate is at least about 15 standard liters per minute, and flowing the process gas through a flow channel extending along a lengthwise direction of the system and being tapered along the lengthwise direction of the system in at least one of a vertical or horizontal direction, wherein the flow channel is defined by an inject insert liner assembly adjacent to the gas distribution plate.

In yet another aspect, a method of depositing a layer on a substrate is described. The substrate is disposed within a processing chamber within a deposition system. The method includes the steps of introducing a process gas into the system from a gas injecting port, flowing the process gas through a gas distribution plate in fluid communication with the gas injecting port and the processing chamber, the gas distribution plate including an inner array of holes and an outer array of holes, and controlling the gas flow distribution across the substrate surface. The controlling step includes selecting at least one orifice-containing plug to be secured within a hole in the gas distribution plate, and securing the selected plug within the hole.

In yet another aspect, a method of depositing a layer on a substrate is described. The substrate is disposed within a processing chamber within a deposition system. The deposition system includes a gas distribution plate in fluid communication with a gas injecting port and the processing chamber. The method includes the steps of introducing a process gas into the system from the gas injecting port, flowing the process gas through a flow channel extending along a lengthwise direction of the system and being tapered along the lengthwise direction of the system in at least one of a vertical or horizontal direction, the flow channel being defined by an inject insert liner assembly adjacent to the gas distribution plate, and depositing a layer on the substrate.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIG. 9 is an exploded front view of the baffle plate and plug combination shown in FIG. 8;

FIG. 10 is an exploded top view of the baffle plate and plug combination shown in FIG. 8;

Like reference symbols used in the various drawings indicate like elements.

DETAILED DESCRIPTION

Figure 1:
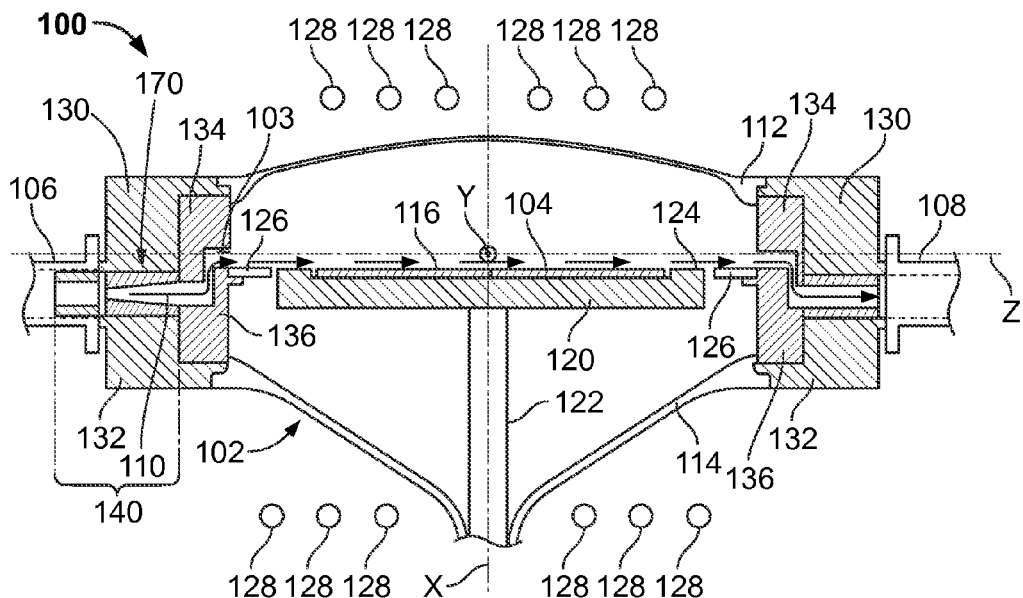
FIG. 1 is a cross-section of a chemical vapor deposition system including a gas manifold of one embodiment of the present disclosure.

A chemical vapor deposition (CVD) system is indicated generally at 100 in FIG. 1. The illustrated system is a single substrate system, however, the system and methods disclosed herein for providing a more uniform gas flow distribution are suitable for use in other system designs including, for example, multiple substrate systems. One example of a CVD system suitable for use in accordance with the present disclosure is the Applied Materials EPI Centura 300.

The CVD system 100 includes a reaction or processing chamber 102 for depositing and/or growing thin films on a substrate 104 (e.g., a semiconductor wafer), a gas injection port 106 disposed at one end of the processing chamber 102, and a gas discharge port 108 disposed at an opposite end of the processing chamber 102. A gas manifold 140 disposed between the gas injecting port 106 and the processing chamber 102 is used to direct incoming gas 110 into the processing chamber 102 enclosed by an upper window 112 and a lower window 114 through the gas injection port 106. As shown in more detail in FIG. 2, the gas manifold 140 includes an injector baffle or gas distribution plate 145 disposed between the gas injecting port 106 and the processing chamber 102, and an inject insert liner assembly 170 disposed adjacent to the baffle plate 145 and upstream from the processing chamber 102. In operation, an incoming process gas 110 flows through the gas manifold 140 and into the reaction chamber 102 through gas inlet 103. The gas 110 then flows over the substrate surface 116 and reacts with the substrate surface 116, or precursors disposed thereon, to deposit a film on the substrate surface 116. The gas 110 then flows out of the reaction chamber 102 and through the gas discharge port 108.

The substrate 104 upon which the film is deposited is supported by a susceptor 120 within the reaction chamber 102. The susceptor 120 is connected to a shaft 122 that is connected to a motor (not shown) of a rotation mechanism (not shown) for rotation of the shaft 122, susceptor 120 and substrate 104 about a vertical axis X of the CVD system 100. The outside edge 124 of the susceptor 120 and inside edge of a preheat ring 126 (for heating the incoming gas 110 prior to contact with the substrate 104) are separated by a gap to allow rotation of the susceptor 120. The substrate 104 is rotated to prevent an excess of material from being deposited on the wafer leading edge and provide a more uniform epitaxial layer.

Incoming gas 110 may be heated prior to contacting the substrate 104. Both the preheat ring 126 and the susceptor 120 are generally opaque to absorb radiant heating light produced by high intensity radiant heating lamps 128 that may be located above and below the reaction chamber 102. Equipment other than high intensity lamps 128 may be used to provide heat to the reaction chamber 102 such as, for example, resistance heaters and inductive heaters. Maintaining the preheat ring 126 and the susceptor 120 at a temperature above ambient allows the preheat ring 126 and the susceptor 120 to transfer heat to the incoming gas 110 as the gas 110 passes over the preheat ring 126 and the susceptor 120. The diameter of the substrate 104 may be less than the diameter of the susceptor 120 to allow the susceptor 120 to heat incoming gas 110 before it contacts the substrate 104. The preheat ring 126 and susceptor 120 may be constructed of opaque graphite coated with silicon carbide.

The upper and lower windows 112, 114 each comprise a generally annular body made of a transparent material, such as quartz, to allow radiant heating light to pass into the reaction chamber 102 and onto the preheat ring 126, the susceptor 120, and the wafer 104. The windows 112, 114 may be planar, or, as shown in FIG. 1, the windows 112, 114 may have a generally dome-shaped configuration. Alternatively, one or both of the windows 112, 114 may have an inwardly concave configuration. The upper and lower windows 112, 114 are coupled to the upper and lower chamber walls 130, 132 of the processing chamber 102, respectively.

The upper and lower chamber walls 130, 132 define the outer perimeter of the processing chamber 102, and abut the gas injection port 106 and the gas discharge port 108.

Figure 2:
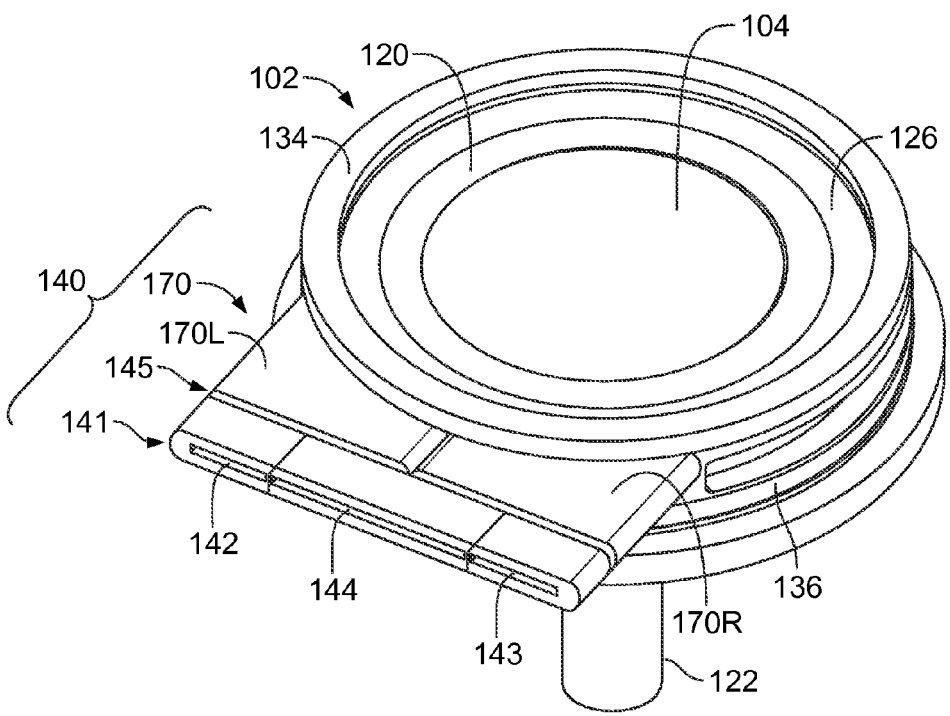
FIG. 2 is a perspective view of the chemical vapor deposition system of FIG. 1, with certain components removed for illustration.

The CVD system 100 may include upper and lower liners 134, 136 disposed within the processing chamber to prevent reactions between the gas 110 and the chamber walls 130, 132 (which are typically fabricated from metallic materials, such as stainless steel). The liners 134, 136 may be fabricated from suitably non-reactive materials, such as quartz. As shown in FIGS. 1 and 2, the upper and lower chamber liners 134, 136 are positioned adjacent to and downstream from the inject insert liner assembly.

Figure 3:
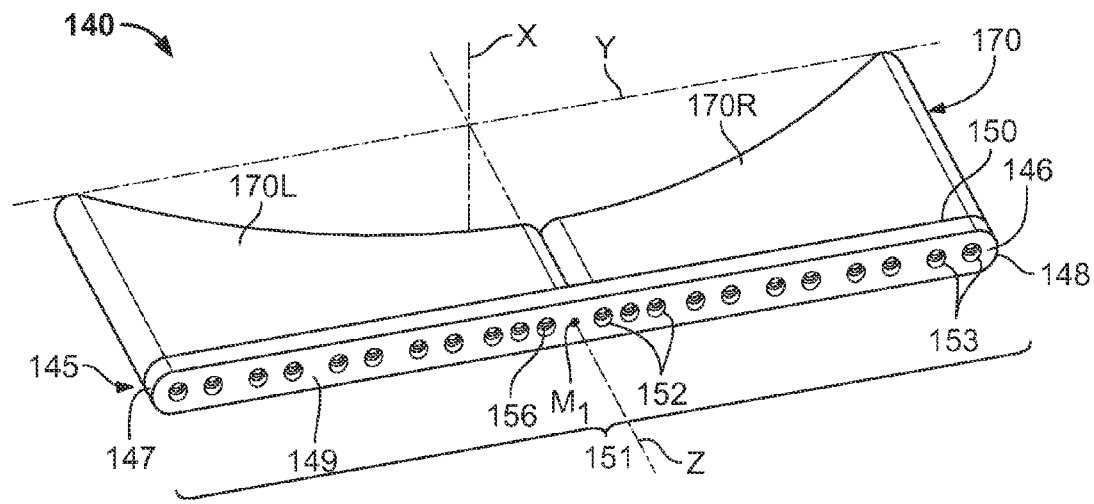
FIG. 3 is a perspective view of the gas manifold shown in FIGS. 1 and 2, including a baffle plate and an inject insert liner assembly of one embodiment of the present disclosure.
Figure 13:
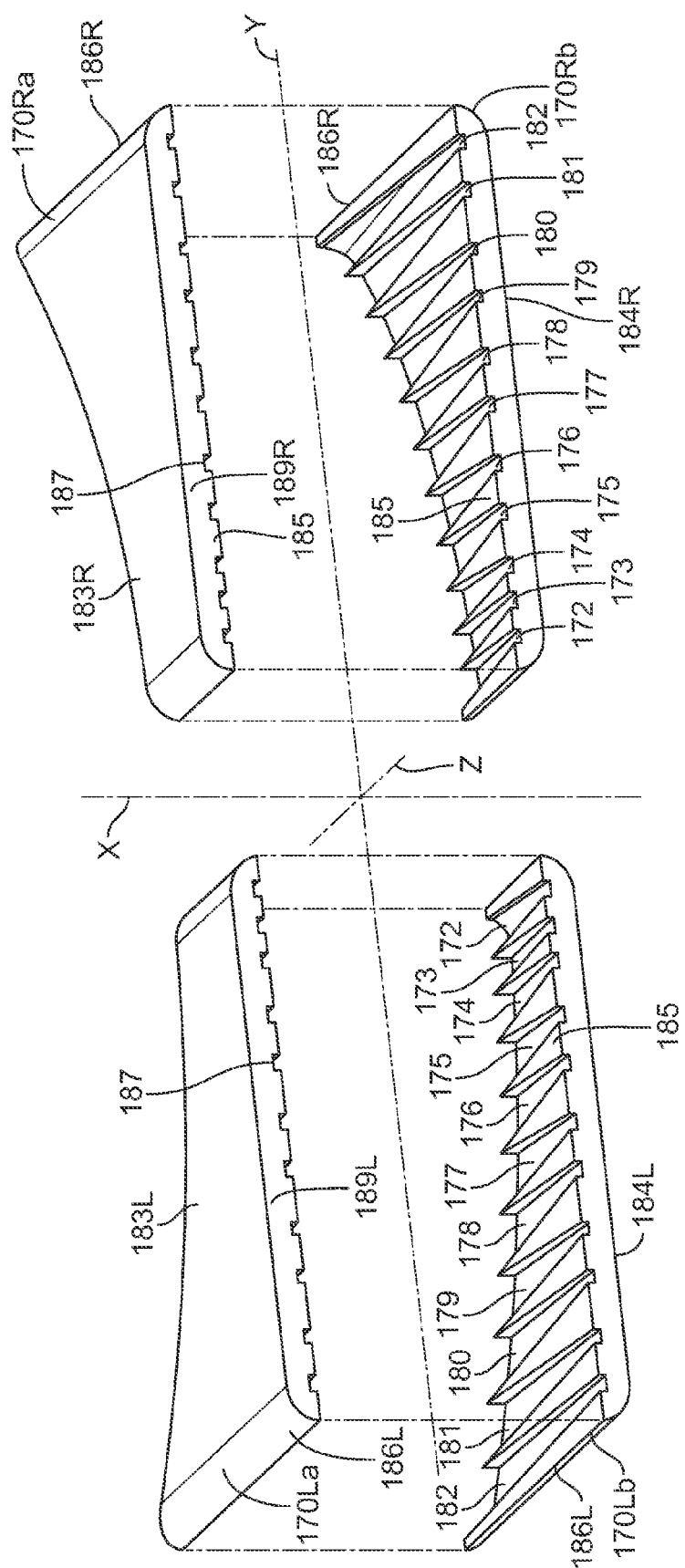
FIGS. 13 and 14 are perspective views of an alternative embodiment of the inject insert liner assembly shown in FIGS. 11 and 12.
Figure 14:
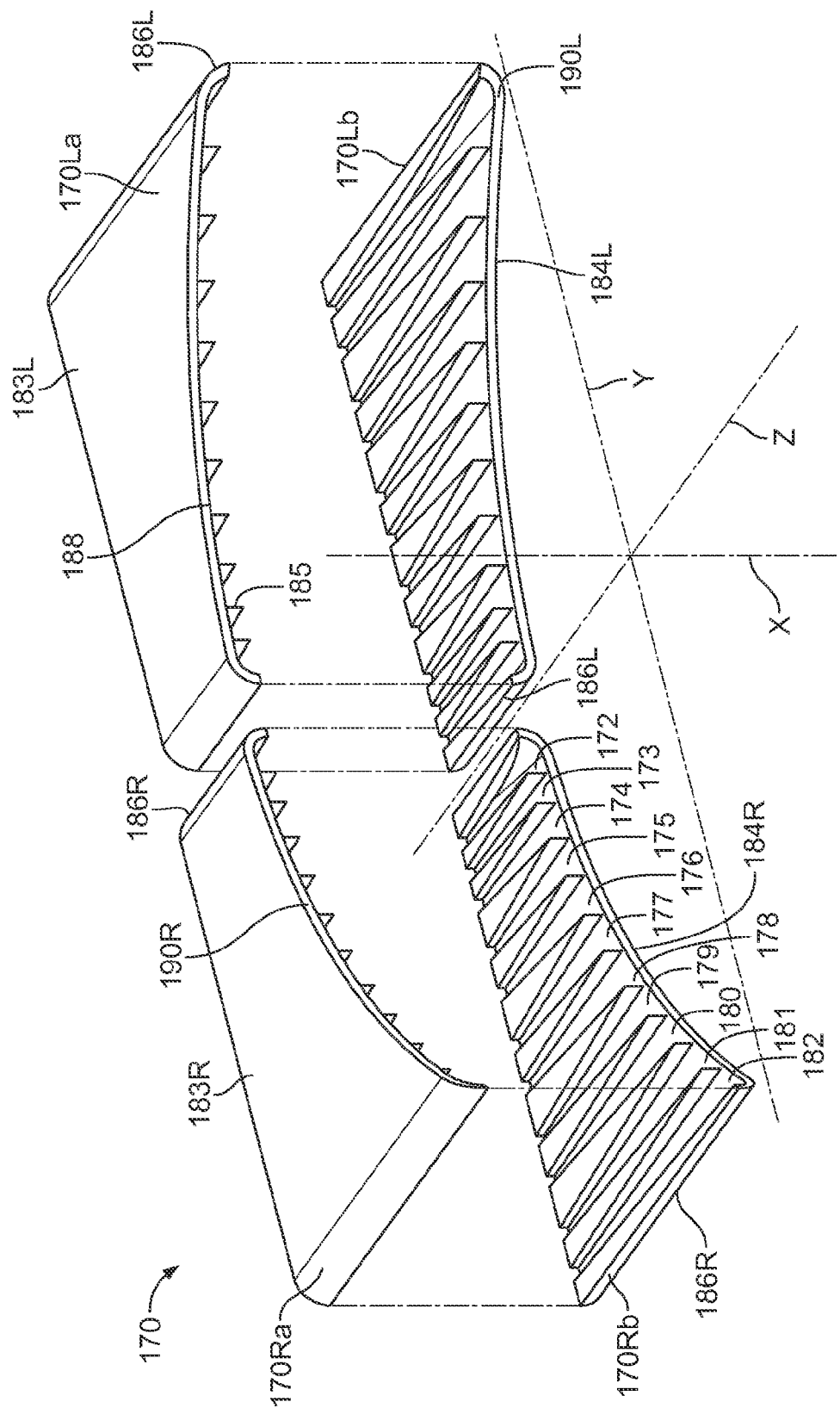

Referring now to FIG. 2, wherein portions of the CVD system 100 have been removed for illustration, the gas manifold 140 includes an injector baffle or gas distribution plate 145 and an inject insert liner assembly 170. The inject insert liner assembly 170 is configured to be received within the system 100 adjacent to the gas distribution plate 145 and upstream from the processing chamber 102. The inject insert liner assembly 170 may be a single or unitary insert, or it may be formed from separate inserts, including, for example, a first inject insert 170L and a second inject insert 170R, as shown in FIG. 3. In some embodiments, the first inject insert 170L and second inject insert 170R may each be further divided into separate components, including upper halves 170La, 170Ra and lower halves 170Lb, 170Rb, as shown in FIGS. 13-14. The manifold 140 may also include an injection port liner 141, which may be divided into two outer injection port liners 142, 143 and an inner injection port liner 144. The injection port liner 141 is in fluid communication with the gas injection port 106. In some embodiments, the gas injection port 106 may be divided into two or more separate process lines (not shown), and the outer injection port liners 142, 143 may be in fluid communication with a source of process gas through a first process line (not shown) and the inner injection port liner 144 may be in fluid communication with a source of process gas through a second process line (not shown) so as to create two flow zones, a central flow zone and an outer flow zone. The compositions and flow rates of the process gases used in the central flow zone and the outer flow zone may be varied and controlled independently from one another. Controlling the respective flow rates of process gases used in the central and outer flow zones affects the radial flow distribution of gases over the substrate and the film thickness uniformity. Flow dynamics of the process gas that passes over the substrate critically impacts the uniformity of the deposited film. A system controller (not shown) may be used to control various operating parameters associated with the reaction chamber 102 including, for example, process gas flow rates and compositions and reaction chamber temperature and pressure. The process gas may also be introduced into the reaction chamber according to other gas manifold configurations.

FIG. 3 illustrates the gas manifold 140 with the injection port liner 141 not shown for illustration. The injector baffle plate 145 includes a body 146, a first end 147, second end 148, front and rear opposing faces 149, 150, and an array 151 of holes 152, 153 within the body 146 extending between faces 149, 150 for distributing gases from the injection port liner 141 to the inject insert liner assembly 170. The body 146 of injector baffle plate 145 may be formed of quartz to reduce contamination within the reaction chamber 102, although other materials may also be suitable for the body 146, including passivated stainless steel (e.g., stainless steel grade 316L), silicon carbide, or any other material that enables the gas manifold 140 to function as described herein.

Figure 4:
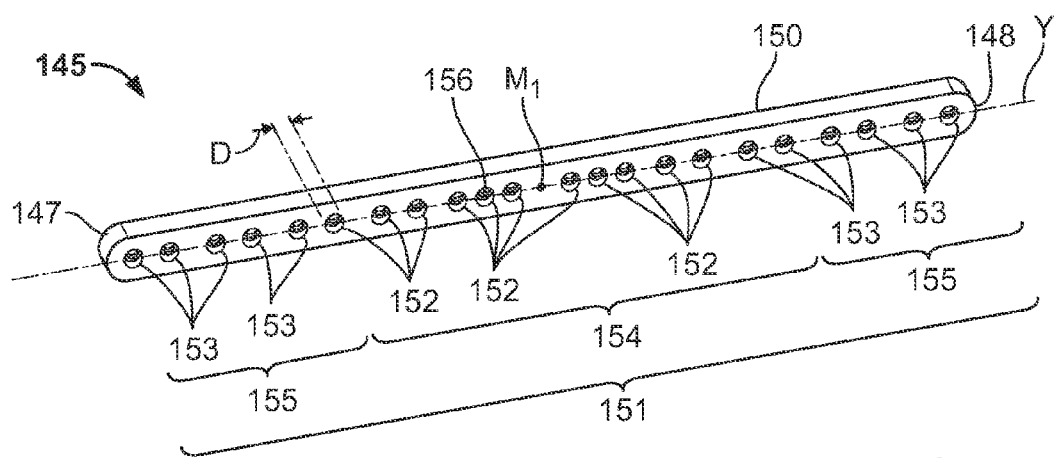
FIG. 4 is a perspective view of the baffle plate shown in FIG. 3.

The array 151 of holes 152, 153 may be arranged along a singular axis extending in a widthwise direction Y of the system 100, although other arrangements are possible, such as a stacked configuration, where two or more holes are arranged above and below one another, a staggered configuration, where the holes are arranged along two or more parallel axes in an alternating pattern, a slantwise configuration, where the holes are arranged along two or more intersecting axes in an alternating pattern, and any combination thereof. The array 151 may include inner and outer arrays 154, 155 of holes 152, 153 characterized by reference to a midpoint M1 midway between the first end 147 and the second end 148 of the baffle plate 145, as shown in FIG. 4. Specifically, the inner array 154 may include one or more holes 152 disposed within a certain distance from midpoint M1 or within a certain number of holes from midpoint M1 (e.g., within 6 holes from the midpoint M1), and the outer array 155 may include one or more holes 153 disposed within a certain distance from either the first end 147 or the second end 148, or within a certain number of holes from the first end 147 or second end 148 (e.g., within holes from the first end 147 or second end 148). In the embodiment shown in FIG. 4, the inner array 154 includes 12 holes 152, disposed within 6 holes on either side of midpoint M1, and the outer array 155 includes 10 holes 153, disposed within 5 holes of either the first end 147 or the second end 148. In certain embodiments, some holes (not shown) in the array 151 may not be included in either the inner array 154 or the outer array 155.

The number, size and cross-sectional shape of holes 152, 153 within baffle plate 145 may vary. In some embodiments, the baffle plate 145 may include between 14 and 30 holes, between 16 and 28 holes, between 18 and 26 holes, or between 20 and 24 holes, although the baffle plate 145 may include any other suitable number of holes 152, 153 that allows the gas manifold 140 to function as described herein. In some embodiments, such as the embodiment shown in FIG. 4, one or more holes 152, 153 may have a circular cross-section, wherein the size of such holes 152, 153 is characterized by an outer diameter D of the hole. In some embodiments, one or more holes may have a polygonal cross-section (e.g., square, rectangular, hexagonal, etc.), wherein the size of such holes is characterized by the distance between opposing faces of the polygon (in the case of a polygon with an even number of sides) or the distance between an opposing face and corner of the polygon (in the case of a polygon with an odd number of sides). In some embodiments, one or more holes may have a rectangular cross-section or an elliptical cross-section (e.g., an elongated slit), wherein the size of such holes is characterized by the length of the major axis of the rectangle or ellipse, and the length of the minor axis of the rectangle or ellipse. In yet other embodiments, one or more holes may have any other suitable shape that allows the gas manifold 140 to function as described herein. In some embodiments, holes having a circular cross-section may have a diameter between about 3 millimeters and about 12 millimeters, between about 6 millimeters and about 10 millimeters, or between about 7 millimeters and about 9 millimeters. In some embodiments, holes having a polygonal cross-section may have a size between about 3 millimeters and about 12 millimeters, between about 6 millimeters and about 10 millimeters, or between about 7 millimeters and about 9 millimeters. In the embodiment shown in FIG. 4, the baffle plate 145 includes 22 holes 152, 153 each having a circular cross-section with a diameter D of about 8 millimeters.

The injector baffle plate 145 may also include one or more locks 156 for securing one or more plugs 160, 163 (shown in FIG. 5) to the injector baffle plate 145. The lock 156 may comprise any means suitable for securing one or more plugs 160, 163 to the injector baffle plate 145, including counter-sunk shoulders, set screws, pins, slots, threads, and even adhesives. In some embodiments, a single lock may be configured to secure more than one plug 160, 163 to the baffle plate 145. The lock 156 may be disposed within one of the holes 152, 153 in the baffle plate 145, or the lock may be disposed outside the holes. In the embodiment shown in FIG. 4, each hole 152, 153 includes a lock 156 comprising a counter-sunk shoulder extending inwardly from the inner surface of the respective hole. Each counter-sunk shoulder is sized to prevent the passage of a plug 160, 163 (shown in FIG. 5) therethrough. The counter-sunk shoulder may extend inwardly from the inner surface of a hole any distance suitable to prevent the passage of a plug therethrough, and to permit the passage of gas therethrough when an orifice-containing plug 160 (shown in FIG. 5) is disposed therein. In some embodiments, one or more counter-sunk shoulders may extend inwardly between about 0.5 millimeters and about 1.5 millimeters. The depth at which the counter-sunk shoulders are disposed in a given hole may vary depending on the thickness of a plug to be received within the hole. In some embodiments, one or more counter-sunk shoulders may be disposed within a hole at a depth of between about 3 millimeters and about 8 millimeters, between about 4 millimeters and about 7 millimeters, or between about 5 millimeters and about 6 millimeters. In the embodiment shown in FIG. 4, each hole 152, 153 includes a lock 156 comprising a counter-sunk shoulder extending inwardly a distance of about 1 millimeter from the inner surface of the hole, and disposed at a depth of about 5.4 millimeters.

Figure 5:
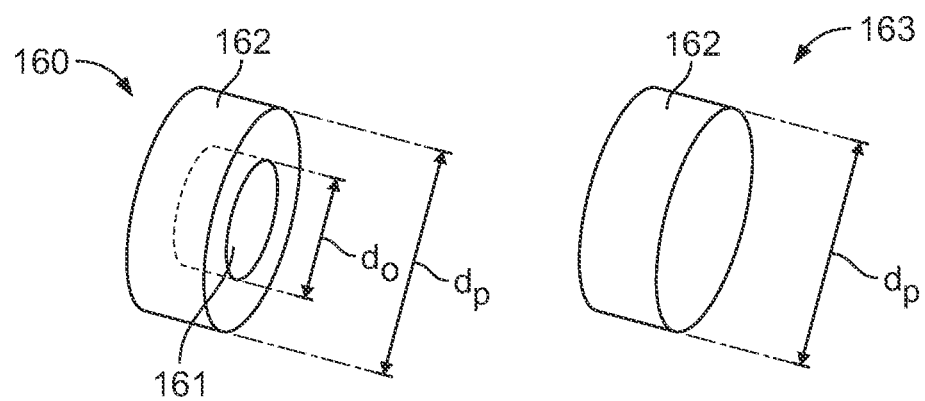
FIG. 5 is a perspective view of two plugs suitable for use with the baffle plate shown in FIG. 4.

Referring now to FIG. 5, one or more plugs 160, 163 each sized to be received within one or more of the holes 152, 153 may be provided to control the gas flow distribution across the substrate surface 116 within the reaction chamber 102. The plugs 160, 163 may be formed of quartz, although other materials may also be suitable for the plugs 160, 163, including passivated stainless steel (e.g., stainless steel grade 316L), silicon carbide, or any other material that enables the gas manifold 140 to function as described herein. In some embodiments, one or more of the plugs 160 may include an orifice 161 therethrough to permit the passage of gas. In some embodiments, one or more of the plugs 163 may be solid with no orifice therethrough to restrict the passage of gas. The baffle plate 145 and plugs 160, 163 aid the operator (not shown) of the CVD system in controlling the gas flow distribution across the substrate surface 116 by permitting the size of the holes 152, 153 within baffle plate 145 to be easily adjusted by inserting or removing a selected plug from a selected hole. The baffle plate 145 and plugs 160, 163 thus provide the operator with the ability to selectively adjust the gas flow distribution across the substrate surface. In some embodiments, one or more plugs 160, 163 may be capable of being removably secured to the baffle plate 145 within one of the holes 152, 153 (e.g., by a counter-sunk shoulder within baffle plate 145), thereby facilitating the ability to adjust and control the gas flow distribution across the substrate surface 116.

Figure 6:
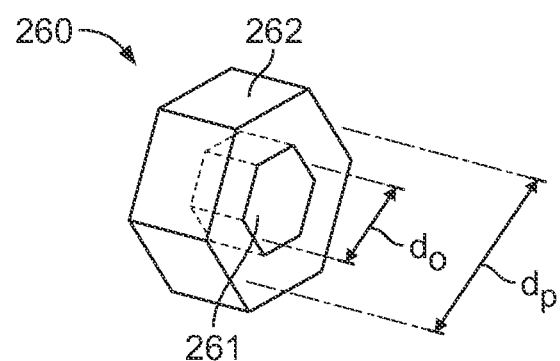
FIG. 6 is an alternative embodiment of the plugs shown in FIG. 5.

Each plug 160, 163 includes a body 162 sized to be received within one or more of the holes 152, 153 in the baffle plate 145. The size and cross-sectional shape of each plug may vary. In some embodiments, one or more plugs may include a generally cylindrical body, such as the plug 160 shown in FIG. 5, wherein the size of such plugs is characterized by the outer diameter of the body dp. In some embodiments, one or more plugs may include a polygonal body, such as the plug 260 shown in FIG. 6, wherein the size of such plugs is characterized by the distance dp between opposing faces of the polygon (in the case of a polygon with an even number of sides) or the distance between an opposing face and corner of the polygon (in the case of a polygon with an odd number of sides). In some embodiments, one or more plugs may include a generally rectangular body or a generally elliptical body, wherein the size of such plugs is characterized by the length of the major axis of the rectangle or ellipse, and the length of the minor axis of the rectangle or ellipse. In yet other embodiments, one or more plugs may have any other suitable shape that allows the gas manifold 140 to function as described herein. In some embodiments, one or more plugs may have a size between about 3 millimeters and about 12 millimeters, between about 6 millimeters and about 10 millimeters, or between about 7 millimeters and about 9 millimeters. In the embodiment shown in FIG. 5, each plug 160, 163 includes a generally cylindrical body 162 having an outer diameter dp of about 8 millimeters.

Figure 7:
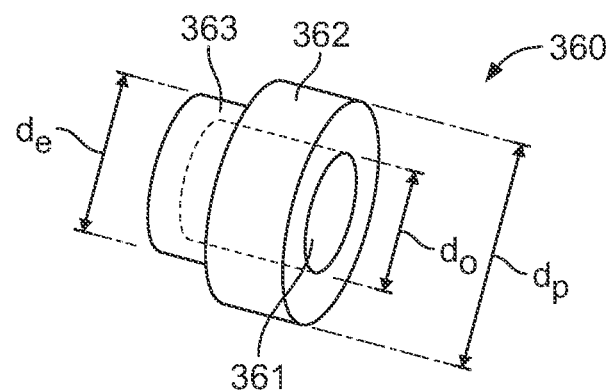
FIG. 7 is another alternative embodiment of the plugs shown in FIG. 5.

Referring to FIG. 7, in yet other embodiments, one or more plugs 360 may include a plug extension portion 363 having a size $d_e$ different than the primary size $d_p$ of the plug body 362. Orifice-containing plugs, such as the orifice containing-plug 361 shown in FIG. 7, as well as solid plugs with no orifice therein, such as the plug 163 shown in FIG. 5, may include a plug extension portion 363. In some embodiments, one or more plug extension portions 363 may be sized to be received within a lock 156 within a baffle plate hole 152, 153. In some embodiments, one or more plug extension portions 363 may be sized to be received within a counter-sunk shoulder. In the embodiment shown in FIG. 7, the plug extension portion 363 is sized to be received within a counter-sunk shoulder. In the embodiment shown in FIG. 7, the plug extension portion 363 has a size $d_e$ of about 7.0 millimeters, and plug body 362 has a primary size $d_p$ of about 8.0 millimeters.

Each orifice 161 extending through each orifice-containing plug, such as the orifice-containing plug 160 shown in FIG. 5, has a cross-sectional shape. The size and cross-sectional shape of orifices 161 in different orifice-containing plugs 160 may vary. In some embodiments, one or more orifices 161 in one or more orifice-containing plugs 160 may comprise a circular aperture, such as the orifice 161 shown in FIG. 5, wherein the size of such apertures is characterized by the inner diameter $d_o$ of such apertures. In some embodiments, one or more orifices 161 in one or more orifice-containing plugs 260 may comprise a polygonal cross-section, such as the orifice 261 shown in FIG. 6, wherein the size of such orifices is characterized by the distance $d_o$ between opposing faces of the polygon (in the case of a polygon with an even number of sides) or the distance between an opposing face and corner of the polygon (in the case of a polygon with an odd number of sides). In some embodiments, one or more orifices in one or more orifice-containing plugs may include a generally elliptical cross-section, wherein the size of such orifices is characterized by the length of the major axis of the ellipse. In yet other embodiments, one or more orifices may have any other suitably shaped cross-section that allows the gas manifold 140 to function as described herein. In some embodiments, one or more orifices having a circular cross-section may have an inner diameter between about 1 millimeter and about 7 millimeters, between about 2 millimeters and about 6 millimeters, or between about 2 millimeters and about 5 millimeters. In some embodiments, one or more orifices may have a size between about millimeter and about 7 millimeters, between about 2 millimeters and about 6 millimeters, or between about 2 millimeters and about 5 millimeters.

Any combination of plugs having any combination of size, body shape, orifice shape, and orifice size may be used in a single embodiment. Because the plugs may be removably secured to the baffle plate, the effective size of each baffle plate hole can easily be adjusted by using different plug combinations with the baffle plate. As a result, the gas flow distribution across the substrate surface may be selectively adjusted, and more uniform growth rates can be achieved in chemical vapor deposition systems employing the gas manifolds described herein.

Figure 8:
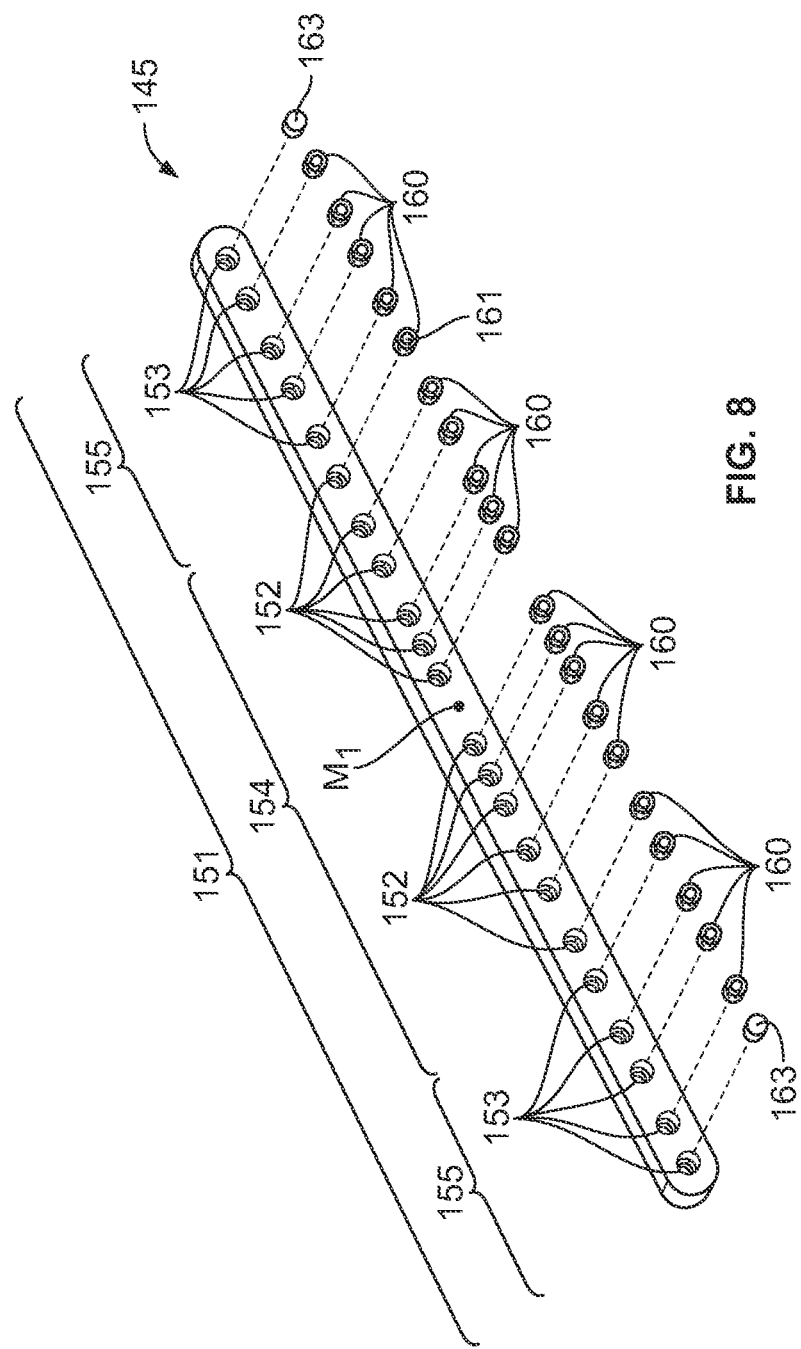
FIG. 8 is a perspective view of a baffle plate and plug combination of one embodiment of the present disclosure.

In certain embodiments, the size, body shape, orifice shape, and orifice size of the plugs 160, 163 may vary depending upon the position of the plug 160, 163 within the array of holes. For example, referring to the embodiment shown in FIGS. 8-10, a plurality of plugs 160, 163 are disposed within the array 151 of holes 152, 153 in the baffle plate 145. The array 151 of holes 152, 153 includes an inner array 154 of holes 152 and an outer array 155 of holes 153. Several of the plugs 160 include orifices 161, wherein each orifice 161 comprises a circular aperture having a diameter $d_o$. In other embodiments, the orifices may have polygonal cross-sections, elliptical cross-sections, or any other suitably shaped cross-section that allows the gas manifold 140 to function as described herein. Referring again to FIGS. 8-10, each aperture-containing plug 160 disposed in the inner array 154 has an aperture diameter $d_o$ between about millimeters and about 6 millimeters. In other embodiments, each aperture-containing plug 160 disposed in the inner array 154 may have an aperture diameter $d_p$ between about 4 millimeters and about 5 millimeters. In the embodiment shown in FIGS. 8-10, at least one plug 163 disposed in the outer array 155 of holes 153 is solid with no holes therein. In other embodiments, each plug disposed in the outer array has an orifice therethrough. In the embodiment shown in FIGS. 8-10, the aperture-containing plugs 160 disposed in the outer array 155 each have an aperture diameter $d_p$ between about 1 millimeter and 6 millimeters. In other embodiments, each aperture-containing plug 160 disposed in the outer array 155 has an aperture diameter $d_p$ between about 2 millimeters and about 5 millimeters.

Figure 11:
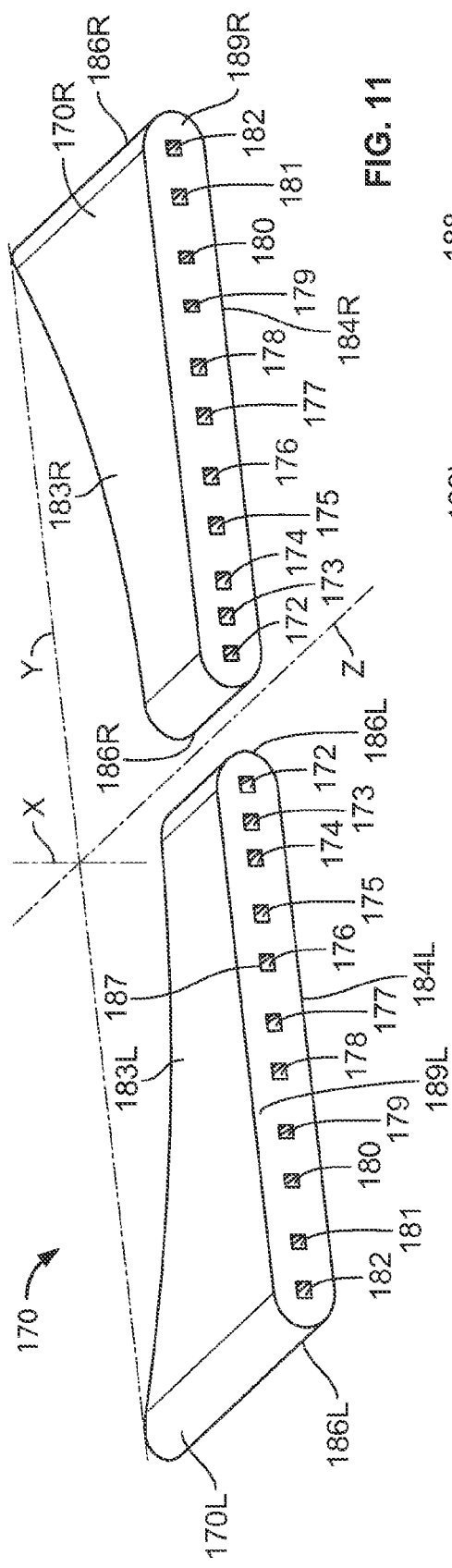
FIGS. 11 and 12 are perspective views of the inject insert liner assembly shown in FIG. 3.
Figure 12:
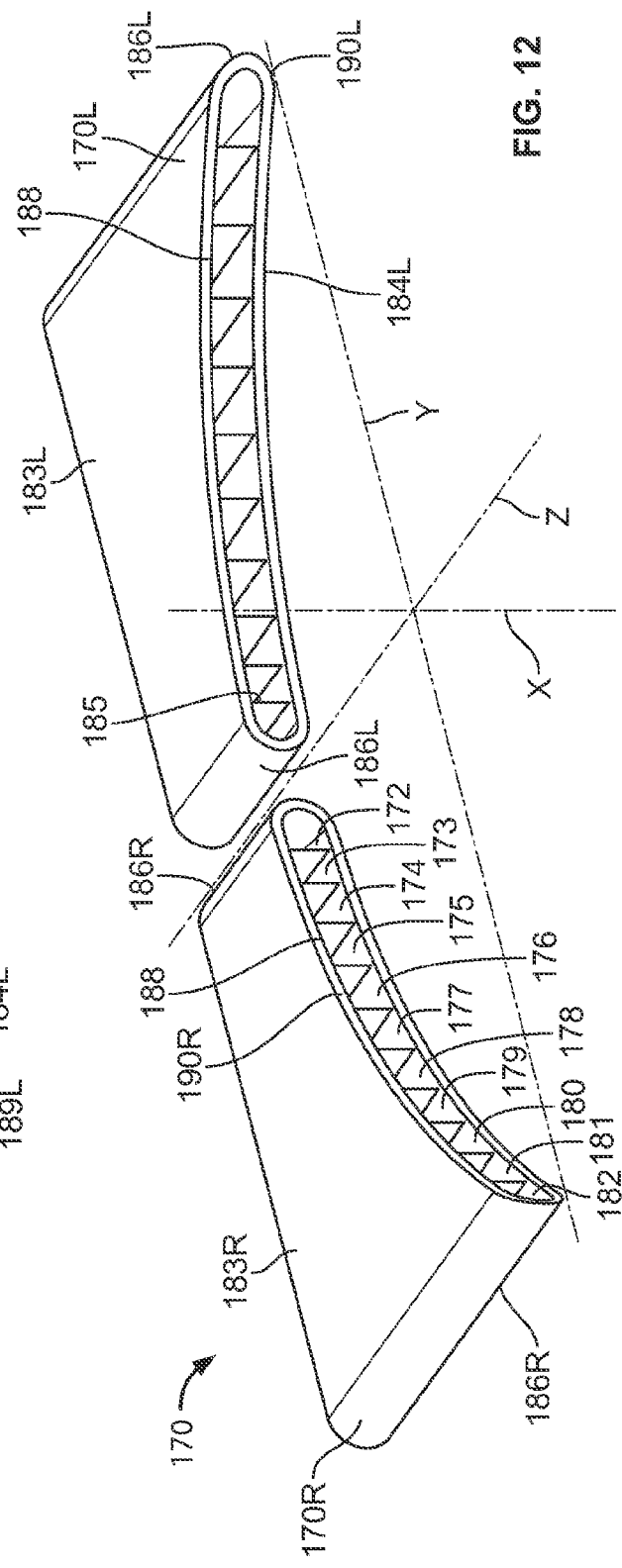

Referring now to FIGS. 11-12, the gas manifold 140 of FIG. 3 is shown with the baffle plate 145 not shown for illustration. As discussed above, the inject insert liner assembly 170 may be a single or unitary insert, or it may be formed from separate inserts, including, for example, a first inject insert 170L and a second inject insert 170R. In some embodiments, the first inject insert 170L and second inject insert 170R may each be further divided into separate components, including upper halves 170La, 170Ra and lower halves 170Lb, 170Rb, as shown in FIGS. 13-14. Inject inserts comprising separate components makes fabricating the gas flow channels therein (described below) easier than inject inserts comprising a unitary construction. Whereas features of the first inject insert 170L and the second inject insert 170R are described in more detail below, it should be understood that a unitary insert may include any one or more of these features. The inject inserts 170L, 170R may be fabricated from quartz or, more specifically, transparent quartz, although other materials may also be suitable, including passivated stainless steel (e.g., stainless steel grade 316L), silicon carbide, or any other material that enables the gas manifold 140 to function as described herein.

Each inject insert 170L, 170R includes a plurality of gas flow channels 172-182 defined therein disposed along a widthwise or horizontal direction Y of the system 100, each extending in a lengthwise direction Z of the system 100. The flow channels 172-182 provide fluid communication between the gas injection port 106 and the processing chamber 102. Each flow channel 172-182 is defined by four surfaces within each inject insert 170L, 170R. The surfaces defining a given flow channel may vary depending on whether the flow channel is an interior flow channel 173-181 or an exterior flow channel 172, 182. Interior flow channels 173-181 may be defined by an upper surface 183L, 183R of the inject inserts 170L, 170R, a lower surface 184L, 184R of the inject insert 170L, 170R, and the surfaces of neighboring partition walls 185. Exterior flow channels 172, 182 may be defined by the upper surface 183L, 183R of the inject insert 170L, 170R, the lower surface 184L, 184R of the inject insert 170L, 170R, a surface of a partition wall 185, and one of the outer peripheral surfaces 186L, 186R of the inject insert 170L, 170R. The partition walls 185 shown in FIGS. 11-12 extend vertically between the upper and lower surfaces 183, 184 of each inject insert 170L, 170R, and extend the length of the inject insert 170L, 170R in a lengthwise direction Z of the system 100.

Each flow channel 172-182 includes an inlet 187 adjacent to the baffle plate 145, and an outlet 188 downstream from the inlet 187. The inlet 187 may be disposed on the front surface 189L, 189R of the inject insert 170L, 170R, and the outlet 188 may be disposed on the rear surface 190L, 190R of the inject insert 170L, 170R. The cross-sectional shape of each inlet 187 may be square, circular, elliptical, rectangular, polygonal, or any other suitable shape that allows the gas manifold 140 to function as described herein. The cross-sectional shape of each outlet 188 may also be square, circular, elliptical, rectangular, polygonal, or any other suitable shape that allows the gas manifold 140 to function as described herein. The outlet corresponding to a given inlet may have the same cross-sectional shape as the inlet, or the outlet may have a different cross-sectional shape than the corresponding inlet. In the embodiment shown in FIGS. 11-12, the cross-sectional shape of each inlet 187 is square, the cross-sectional shape of each outlet 188 corresponding to an interior flow channel 173-181 is rectangular, and the cross-sectional shape of each outlet 188 corresponding to an exterior flow channel 172, 182 is partially square and partially rounded.

The cross-sectional area of each inlet 187 may be any size suitable to allow the gas manifold 140 to function as described herein. In some embodiments, the cross-sectional area of one or more inlets 187 may be sized based upon the size of one or more holes in the baffle plate. For example, in embodiments where one or more flow channels 172-182 each correspond to a single hole in the baffle plate (described below), the cross-sectional area of one or more inlets 187 may be less than about 10 times the cross-sectional area of the corresponding baffle plate hole, less than about 5 times the cross-sectional area of the corresponding baffle plate hole, or less than about 3 times the cross-sectional area of the corresponding baffle plate hole. In embodiments where the baffle plate contains one or more orifice containing plugs, such as the orifice-containing plug 160 shown in FIG. 5, the cross-sectional area of one or more inlets 187 may be sized based upon the size of one or more orifices in the orifice-containing plugs disposed in the baffle plate. For example, in embodiments where one or more flow channels 172-182 each correspond to a single hole in the baffle plate (described below), and one or more holes in the baffle plate contains an orifice containing plug therein, the cross-sectional area of one or more inlets 187 may be less than about 5 times the cross-sectional area of the orifice in an orifice-containing plug, less than about 3 times the cross-sectional area of the orifice in an orifice-containing plug, or less than about 1.5 times the cross-sectional area of the orifice in an orifice-containing plug. In the embodiment shown in FIGS. 11-12, the cross-sectional area of each inlet 187 is less than about 1.5 times the cross-sectional area of the largest orifice 161 in the orifice-containing plugs 160 disposed in the baffle plate 145. In some embodiments, the cross-sectional area of one or more inlets 187 may be sized based upon the cross-sectional area of the outlet 188 corresponding to that inlet. In particular, one or more inlets 187 may be sized such that the cross-sectional area of the inlet is less than the cross-sectional area of the outlet corresponding to that inlet.

The front surface 189L, 189R of each inject insert 170L, 170R is generally planar and sits substantially flush with the baffle plate 145 when disposed within the system 100. The rear surface 190L, 190R of each inject insert 170L, 170R may be curved inwardly to match the contours of the upper and lower liners 134, 136, as shown in FIGS. 2 and 11-12. In some embodiments, the front surface of an inject insert may be adjoined to the baffle plate such that the baffle plate and the inject insert comprise a unitary member.

The number of flow channels 172-182 defined within the inject insert liner assembly 170 may vary in different embodiments. In some embodiments, the total number of flow channels defined by the inject insert liner assembly 170 may be between 16 and 28, between 18 and 26, or between 20 and 24, although the total number of flow channels may be any other suitable number that allows the gas manifold 140 to function as described herein. In the embodiment shown in FIGS. 11-12, the inject insert liner assembly 170 includes a total of 22 gas flow channels 172-182, with each inject insert 170L, 170R having 11 flow channels therein. In some embodiments, the number of flow channels 172-182 defined by the inject insert liner assembly 170 may correspond to the number of holes in baffle plate 145. In some embodiments, there may be a one-to-one correspondence between the number of holes in baffle plate 145 and the number of flow channels 172-182 defined by the inject insert liner assembly 170. In other embodiments, the correspondence may differ, such as a two-to-one correspondence (i.e., two holes for every one flow channel), a three-to-one correspondence, a four-to-one correspondence, or a five-to-one correspondence. In the embodiment shown in FIGS. 11-12, there is a one-to-one correspondence between the number of flow channels 172-182 and the number of holes 152, 153 in baffle plate 145. Specifically, the baffle plate 145 includes a total of 22 holes 152, 153, and the inject insert liner assembly 170 includes a total of 22 flow channels 172-182, wherein each of the first and second inject inserts 170L, 170R include 11 flow channels 172-182. Each flow channel 172-182 shown in FIGS. 11-12 corresponds to a single hole 152, 153 in the baffle plate 145 than the other flow channels. CVD systems having a one-to-one correspondence between the number of flow channels and the number of holes in the baffle plate reduces the negative effects associated with "crosstalk" between inner and outer flow zones in the gas manifold, namely, unpredictable tuning responses from adjusting the gas flow rates in the inner and outer flow zones. Additionally, the one-to-one correspondence between the number of flow channels and the number of holes in the baffle plate reduces the negative effects associated with having multiple baffle plate holes in fluid communication with a single inject insert flow channel, namely, the formation of recirculation cells within the inject insert liner assembly.

As shown in FIGS. 11-12, one or more flow channels 172-182 defined within the inject inserts 170L, 170R may be tapered along the lengthwise direction Z of the system 100 in at least one of a vertical (i.e., along the X axis) or horizontal (i.e., along the Y axis) direction. In some embodiments, one or more flow channels may be tapered outwardly in the horizontal direction from the flow channel inlet 187 to the flow channel outlet 188, such as the flow channels 172-182 shown in FIGS. 11-12. In some embodiments, one or more flow channels may be tapered outwardly in the vertical direction from the flow channel inlet 187 to the flow channel outlet 188, such as the flow channels 172-182 shown in FIGS. 11-12. In some embodiments, one or more flow channels may be tapered outwardly in both the vertical and horizontal directions from the flow channel inlet 187 to the flow channel outlet 188, such as the flow channels 172-182 shown in FIGS. 11-12. In some embodiments, one or more flow channels may be tapered inwardly in the vertical direction from the flow channel inlet 187 to the flow channel outlet 188.

The degree of taper in each flow channel 172-182 may vary in different embodiments. In some embodiments, one or more flow channels tapered outwardly in the horizontal direction may be tapered at an angle of between about 1 degree and about 15 degrees, between about 2 degrees and about 10 degrees, or between about 2 degrees and about 7 degrees, wherein the angle of such taper is measured with respect to the lengthwise direction Z of the system 100. In some embodiments, one or more flow channels tapered outwardly in the vertical direction may be tapered at an angle of between about 1 degrees and about 15 degrees, between about 2 degrees and about 10 degrees, or between about 2 degrees and about 7 degrees, wherein the angle of such taper is measured with respect to the lengthwise direction Z of the system 100. In some embodiments, the degree of taper in the horizontal and/or the vertical direction of one or more flow channels may be selected such that the size of the inlets and outlets of the flow channels correspond to the size of the baffle plate holes and the openings formed between the upper and lower liners (shown at 134 and 136 in FIG. 1). In this way, the inject insert liner assemblies described herein can be integrated in CVD systems already in use, and the benefits of such inserts can be realized with little or no modification of existing CVD systems. In some embodiments, the degree of taper in the horizontal and/or the vertical direction of one or more flow channels may be selected such that the size of the inlets correspond to the size of an orifice in an orifice-containing plug disposed in a baffle plate hole, and the size of the outlets correspond to the openings formed between the upper and lower liners (shown at 134 and 136 in FIG. 1). In this way, the inject insert liner assemblies described herein can be integrated in CVD systems employing the novel baffle plate and plugs described herein, and the benefits of such inserts can be realized with little or no modification of such CVD systems.

In the embodiment shown in FIGS. 11-12, the degree of taper in the horizontal and vertical direction of each flow channel 172-182 is selected such that the size of each inlet 187 corresponds to the size of a respective baffle plate hole 152, 153 (i.e., the baffle plate hole in fluid communication with the flow channel), and the size of each outlet 188 corresponds to the openings formed between the upper and lower liners 134, 136. Because the length of each flow channel 172-182 varies in the lengthwise direction Z, the degree of taper in the horizontal and vertical direction of each flow channel 172-182 also varies. For example, flow channels having a shorter length, such as flow channels 172-177, will have higher degrees of taper, such as between about 2 degrees and about 15 degrees in the vertical direction, and between about 2 degrees and 15 degrees in the horizontal direction. Flow channels having a longer length, such as flow channels 178-182, will have a lower degree of taper, such as between about 1 degree and about 10 degrees in the vertical direction, and between about 1 degree and 10 degrees in the horizontal direction. Inject inserts having gradually tapered flow channels from the inlet side to the outlet side, such as inject inserts 170L and 170R, further help prevent the formation of recirculation cells within the inject insert by preventing rapid expansion of the process gas 110 as it flows through the different components of the gas manifold.

In operation, gas is introduced into the CVD system from the gas injecting port at a selected flow rate. The gas manifold 140 is provided within the CVD system 100 to direct incoming gas 110 into the processing chamber 102. The gas manifold 140 may be disposed between the gas injecting port 106 and processing chamber 102. In embodiments where the gas manifold 140 includes an injection port liner 141, the gas manifold 140 may extend into the gas injection port 106, as shown in FIG. 1. The gas manifold 140 may be provided with the novel baffle plate 145 and plugs 160, 163, and the novel inject insert liner assembly 170 described herein, or the gas manifold 140 may be provided with the novel baffle plate 145 and plugs 160, 163 described herein in combination with a conventional inject insert, or the gas manifold may be provided with a conventional baffle plate in combination with the novel inject insert liner assembly 170 described herein.

In CVD systems including the novel baffle plate 145 and plugs 160, 163 described herein, the gas flow distribution across the substrate surface may be controlled by varying the effective size of the holes 152, 153 in the baffle plate 145. For example, one or more plugs 160 having an orifice 161 may be selected to be inserted within one or more holes 152, 153 in the baffle plate 145. Plugs 160 having different orifice sizes may be selected such that the effective size of the baffle plate holes varies across the length of the baffle plate 145. By varying the effective size of the baffle plate holes 152, 153, the gas flow rate at different regions on the substrate surface can be selectively adjusted, thus providing the operator of the CVD system the ability to more selectively control the gas flow distribution across the substrate surface compared to conventional CVD systems.

In some embodiments, the orifice 161 in each orifice-containing plug 160 selected to be inserted into a hole 152, 153 in baffle plate 145 comprises a circular aperture having a diameter $d_o$. The plugs 160 selected to be inserted into the inner array 154 of holes 152 may vary from the plugs 160 selected to be received in the outer array 155 of holes 153. For example, the orifice-containing plugs 160 selected for the inner array 154 of holes 152 may have aperture diameters between about millimeters and about 6 millimeters, or between about 4 millimeters and about 5 millimeters. The orifice-containing plugs 160 selected for the outer array 155 of holes 153 may have aperture diameters between about 1 millimeter and about 6 millimeters, or between about 2 millimeters and about 5 millimeters.

In some embodiments, at least one plug selected to be inserted into the outer array 155 of holes 153 is a solid plug 163 with no holes therein. In some embodiments, each plug selected to be inserted into the outer array 155 of holes 153 is an orifice-containing plug 160. In some embodiments, at least one plug selected to be inserted into the inner array 154 of holes 152 is a solid plug 163 with no holes therein. In some embodiments, each plug selected to be inserted into the inner array 154 of holes 152 is an orifice-containing plug 160.

In CVD systems including the novel baffle plate 145 and plugs 160, 163 and/or the novel inject insert liner assembly 170 described herein, the uniformity of the gas flow distribution across the substrate surface can be maintained at higher gas flow rates than in conventional CVD systems. For example, process gas, such as a tricholorsilane-hydrogen mixture, may be introduced into the CVD system at a flow rate of at least about 15 standard-liters per minute, at least about 17 standard-liters per minute, or even at least about 19 standard-liters per minute, while maintaining a relative layer thickness variation of less than about 4% across the substrate surface, less than about 2% across the substrate surface, or even less than about 1% across the substrate surface. Carrier gas, such as hydrogen, may also be introduced at a higher flow rate, such as at least about 70 standard-liters per minute, at least about standard-liters per minute, or even at least about 90 standard-liters per minute, while maintaining a relative layer thickness variation of less than about 4% across the substrate surface, less than about 2% across the substrate surface, or even less than about 1% across the substrate surface. Because the uniformity of the gas flow distribution across the substrate surface can be maintained at higher gas flow rates, the rate at which a given film or layer is deposited on a substrate may also be increased while maintaining uniformity in the layer thickness. For example, an epitaxial layer may be deposited on a silicon wafer having a diameter of at least about 150 millimeters, at least about 200 millimeters, at least about 300 millimeters, or even at least about 450 millimeters at a deposition rate of at least about 2.3 micrometers per minute, at least about 2.5 micrometers per minute, or even at least about 2.7 micrometers per minute while maintaining a relative layer thickness variation of less than about 4% across the diameter of the wafer, less than about 2% across the diameter of the wafer, or even less than about 1% across the diameter of the wafer.

"Relative layer thickness variation" of a deposited layer is determined by measuring the difference between the maximum layer thickness and the minimum layer thickness, and dividing this difference by the average layer thickness. The resultant value is multiplied by 100 in order to arrive at a percentage. This percentage is the "relative layer thickness variation" as disclosed herein. As used herein, the term "standard-liter" refers to one liter of the referenced gas at 0° C. and 101.3 kPa (1013 millibar).

The embodiments described herein are suited for processing semiconductor or solar-grade wafers, though may be used in other applications. The embodiments described herein are particularly suited for use in atmospheric-pressure silicon on silicon chemical vapor deposition epitaxy using gas mixtures including hydrogen, tricholorosilane, and diborane. Silicon precursors other than tricholorosilane may also be used with the embodiments described herein, including dichlorosilane, silane, trisilane, tetrachlorosilane, methylsilane, pentasilane, neopentasilane, and other higher order silane precursors. Precursors other than silicon precursors may also be used with the embodiments described herein, including germane, digermane, and other germanium precursors. Dopant gas species other than diborane may be used, including phosphine and arsine. The embodiments described herein may also be used in processes other than atmospheric-pressure silicon on silicon epitaxy, including reduced-pressure epitaxy (e.g., at pressures between about 10 Torr and about 750 Torr), silicon-germanium epitaxy, carbon-doped silicon epitaxy, and non-epitaxial chemical vapor deposition. The embodiments described herein may also be used to process wafers other than silicon wafers, including germanium wafers, gallium arsenide wafers, indium phosphide wafers, and silicon carbide wafers.

As described above, gas manifolds including the novel baffle plates and plugs and/or the novel inject insert liner assemblies of the present disclosure provide an improvement over known gas manifolds. The baffle plates and plugs provide the operator of the CVD system the ability to selectively adjust the gas flow distribution across the substrate surface within the processing chamber. As a result, uniformity in gas flow distribution across the substrate surface can be improved, particularly at higher gas flow rates. The inject insert liner assemblies described herein reduce the negative effects associated with crosstalk between multiple flow zones feeding into a single inject insert channel, namely unpredictable tuning responses. These negative effects are avoided by providing, among other things, a one-to-one correspondence between the number of baffle plate holes and the total number of gas flow channels within the inject insert liner assembly. Additionally, the inject insert liner assemblies described herein reduce the negative effects associated with the formation of recirculation cells, namely, degradation in the uniformity of the gas flow distribution within the processing chamber. These negative effects are avoided by providing inject insert liner assemblies having gas flow channels that are gradually tapered along a lengthwise direction of the CVD system.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A system for depositing a layer on a substrate, the system comprising:
    a processing chamber;
    a gas injecting port for introducing gas into the system, the gas injecting port disposed upstream from the processing chamber;
    a gas distribution plate disposed between the gas injecting port and the processing chamber, the gas distribution plate including holes therein;
    an inject insert liner assembly received within the system adjacent to the gas distribution plate and upstream from the processing chamber, the inject insert liner assembly defining gas flow channels therein extending along a lengthwise direction of the system, wherein the inject insert liner assembly defines an inlet of each channel adjacent to the gas distribution plate and an outlet of each channel downstream from the inlet; and
    a chamber liner positioned adjacent to and downstream from the inject insert liner assembly, the chamber liner at least partially defining a gas inlet in fluid communication with at least one of the gas flow channels defined by the inject insert liner assembly;
    wherein at least one of the gas flow channels is tapered between the channel inlet and the channel outlet along the lengthwise direction of the system in at least one of a vertical or horizontal direction, and wherein the inject insert liner assembly has the same number of gas flow channels as the number of holes in the gas distribution plate.

2. The system as set forth in claim 1 wherein each channel corresponds to a single hole in the gas distribution plate and each inlet of each channel has a cross-sectional area less than about 5 times a cross-sectional area of a gas distribution plate hole corresponding to that channel.

3. The system as set forth in claim 1 wherein at least one channel is tapered outwardly in the horizontal direction from the channel inlet to the channel outlet.

4. The system as set forth in claim 3 wherein at least one channel tapered outwardly in the horizontal direction is tapered at an angle of between about 1 degree and about 15 degrees in the horizontal direction.

5. The system as set forth in claim 1 wherein at least one channel is tapered outwardly in the vertical direction from the channel inlet to the channel outlet.

6. The system as set forth in claim 5 wherein at least one channel tapered outwardly in the vertical direction is tapered at an angle of between about 1 degree and about 15 degrees in the vertical direction.

7. The system as set forth in claim 1 wherein at least one channel is tapered inwardly in the vertical direction from the channel inlet to the channel outlet.

8. The system as set forth in claim 1 wherein the gas distribution plate and the inject insert liner assembly are a unitary member.

9. The system as set forth in claim 1 wherein the inject insert liner assembly includes an upper half and a lower half.

10. A system for depositing a layer on a substrate, the system comprising:
    a processing chamber;
    a gas injecting port for introducing gas into the system, the gas injecting port disposed upstream from the processing chamber;
    a gas distribution plate disposed between the gas injecting port and the processing chamber, the gas distribution plate including holes therein;
    an inject insert liner assembly received within the system adjacent to the gas distribution plate and upstream from the processing chamber, the inject insert liner assembly defining gas flow channels therein extending along a lengthwise direction of the system, the inject insert liner assembly defining an inlet of each channel adjacent to the gas distribution plate and an outlet of each channel downstream from the inlet; and
    a chamber liner positioned adjacent to and downstream from the inject insert liner assembly, the chamber liner at least partially defining a gas inlet in fluid communication with at least one of the gas flow channels defined by the inject insert liner assembly;

wherein each channel is tapered from the channel inlet to the channel outlet along the lengthwise direction of the system in at least one of a vertical or horizontal direction.

11. The system as set forth in claim 10 wherein the inject insert liner assembly has the same number of gas flow channels as the number of holes in the gas distribution plate.

12. The system as set forth in claim 11 wherein each channel corresponds to a single hole in the gas distribution plate and each inlet of each channel has a cross-sectional area less than 5 times a cross-sectional area of a gas distribution plate hole corresponding to that channel.

13. The system as set forth in claim 10 wherein at least one channel is tapered outwardly in the horizontal direction from the channel inlet to the channel outlet.

14. The system as set forth in claim 13 wherein at least one channel tapered in the horizontal direction is tapered at an angle of between about 1 degree and about 15 degrees in the horizontal direction.

15. The system as set forth in claim 10 wherein at least one channel is tapered outwardly in the vertical direction from the channel inlet to the channel outlet.

16. The system as set forth in claim 15 wherein at least one channel tapered outwardly in the vertical direction is tapered at an angle of between about 1 degree and about 15 degrees in the vertical direction.

17. The system as set forth in claim 10 wherein at least one channel is tapered inwardly in the vertical direction from the channel inlet to the channel outlet.

18. The system as set forth in claim 10 wherein the inject insert liner assembly is a unitary member.

19. The system as set forth in claim 10 wherein the inject insert liner assembly includes an upper half and a lower half.

20. A system for depositing a layer on a substrate, the system comprising:
   a processing chamber;
   a gas injecting port for introducing gas into the system, the gas injecting port disposed upstream from the processing chamber;
   a gas distribution plate disposed between the gas injecting port and the processing chamber, the gas distribution plate including holes therein; and
   an inject insert liner assembly abutting the gas distribution plate, the inject insert liner assembly defining gas flow channels therein extending along a lengthwise direction of the system, the inject insert liner assembly defining an inlet of each channel adjacent to the gas distribution plate and an outlet of each channel downstream from the inlet, wherein each channel is continuously and gradually tapered from the channel inlet to the channel outlet in at least one of a vertical or horizontal direction.

21. The system as set forth in claim 20, further comprising a chamber liner positioned adjacent to and downstream from the inject insert liner assembly, the chamber liner at least partially defining a gas inlet in fluid communication with at least one of the gas flow channels defined by the inject insert liner assembly.

22. The system as set forth in claim 20 wherein the inject insert liner assembly has the same number of gas flow channels as the number of holes in the gas distribution plate.

23. The system of claim 22, wherein each channel corresponds to single hole in the gas distribution plate and each inlet of each channel has a cross-sectional area less than 5 times a cross-sectional area of a gas distribution plate hole corresponding to that channel.

* * * * *